United States Patent [19]
Jakobson

[11] Patent Number: 5,392,305
[45] Date of Patent: Feb. 21, 1995

[54] PACKAGING OF HIGH POWER SEMICONDUCTOR LASERS

[75] Inventor: Paul A. Jakobson, Corning, N.Y.

[73] Assignee: Corning Incorported, Corning, N.Y.

[21] Appl. No.: 91,657

[22] Filed: Jul. 14, 1993

[51] Int. Cl.$^6$ ............................................... H01S 3/19
[52] U.S. Cl. ........................................ 372/43; 372/34; 372/36; 257/678; 257/679
[58] Field of Search ................... 372/34, 36, 43, 44; 257/678, 679

[56] References Cited

U.S. PATENT DOCUMENTS 4,769,345  9/1988  Butt et al. ........................... 257/682
5,058,124  10/1991 Cameron et al. ...................... 372/34

OTHER PUBLICATIONS

Analysis of Rapid Degradation in High-Powered (AlGa) As Laser Diodes by William J. Fritz published in IEEE Journal of Quantum Electronics, vol. 26, No. 1, Jan. 1993, pp. 68–69.

Military Standard—Certification Requirements for Hybrid Microcircuit Facilities and Lines, published in Statement Approved for Public Release, 15 May 1987 Department of Defense. MIL-STD-1772A.

Considerations in the Hermetic Packaging of Hybrid Microcircuits by Marjorie Byrnes, Jerry Carter, Jerry Sergent, and Dennis King in Solid State Technology publication, Aug. 1984, pp. 183–186.

Primary Examiner—Georgia Y. Epps
Attorney, Agent, or Firm—William J. Simmons; William J. Chervenak

[57] ABSTRACT

A package for a high power semiconductor laser comprising a hermetically sealed container filled with a dry gaseous medium containing oxygen. The presence of oxygen in the laser atmosphere is counter to standard practice in the art which teaches the use of an atmosphere of a dry inert gas.

11 Claims, 2 Drawing Sheets

PACKAGING OF HIGH POWER SEMICONDUCTOR LASERS

BACKGROUND OF THE INVENTION

This invention relates to a package for a high power semiconductor laser and a method of packaging a high power semiconductor laser.

Semiconductor laser technology has matured to produce devices which are suitable for applications requiring long term, reliable laser operation. Strategies for maintaining laser stability and prolonging laser life include control of the laser operating environment. In particular, the temperature, humidity and atmosphere in which the laser operates are controlled. The preferred atmosphere taught in prior art is relatively inert with respect to the semiconductor laser materials. In particular, the art teaches that an atmosphere free of oxygen extends laser life. Also a dry atmosphere is preferred to prevent reaction with the laser materials and to preserve the integrity of the miniature electric circuitry associated with the laser operation. For a further discussion of appropriate microcircuit packaging see, "Considerations in the Hermetic Packaging of Hybrid Microcircuits", Byrnes et al., *Solid State Technology*, 1984. For example, an atmosphere of dry nitrogen with a helium tracer provides a favorable laser operating environment. The term dry, as used in this document, in general refers to a gaseous medium having a water content less than about 5000 ppm.

However, as semiconductor laser facet power has increased to 50 mW and higher, these generally accepted strategies for stable, long term laser operation have proved inadequate. Laser end facets, which essentially delimit the lasing cavity, can change in reflectivity and even be destroyed when a high power laser is operated in a dry helium/nitrogen atmosphere. Materials which can contaminate the container include solder flux, oils, epoxies and cleaning agents used in the process. Their presence can result in particulate and gaseous contamination reaching the surface of the facet coatings, 9 or 5 in FIG. 1, and producing impurity deposits thereon. Such deposits can change the facet reflectivity, reducing transmitted power, and increasing absorptivity at the facet which causes facet heating and eventual laser failure. Therefore, new strategies are needed to meet those laser applications which require high power together with assurance of laser stability and longevity.

BRIEF DESCRIPTION OF THE INVENTION

The present invention meets the need for stable, long term operation of a high power laser by providing an environment which is protective of the materials which comprise the laser. In this document, the term high power laser refers to a semiconductor laser having a front facet power of at least 50 mW.

One aspect of the invention is a packaged high power semiconductor laser comprising the laser surrounded by a hermetically sealed container filled with a gaseous medium containing at least 100 ppm oxygen. One embodiment of the invention utilizes a package containing air having less than 5000 ppm water as the gaseous medium. However, other embodiments are contemplated which have a gaseous medium comprising components relatively inert with respect to the semiconductor laser materials, and an amount of oxygen effective to prevent impurity depositions on the facet structure. Because of the deleterious affects of water on microcircuits, very low water content, less than 1000 ppm, is preferred.

Another aspect of the invention is a method for hermetically sealing a high power semiconductor laser in a container filled with a gaseous medium. The laser is mounted on an optical platform. The optical platform is sealed in a hermetic container filled with a gaseous medium comprising components relatively inert with respect to the semiconductor laser materials and in addition containing an amount of oxygen effective to prevent impurity depositions on the laser facet structure. The water content of the gaseous medium is less than 5000 ppm. A preferred water content is 1000 ppm.

The invention is also directed to a high power semiconductor laser wherein the laser is enclosed in a hermetically sealed container filled with a gaseous medium containing at least 100 ppm oxygen, i.e., a gaseous medium wherein the oxygen content is greater than 100 ppm. As stated above, the amount of oxygen is preferably an amount effective to prevent impurity depositions on the laser facet structure.

A further aspect of the invention is a pump source for an optical waveguide fiber amplifier comprising a high power semiconductor laser wherein said laser is positioned in a hermetically sealed container filled with a dry gaseous medium containing at least 100 ppm of oxygen. One embodiment of the pump source comprises a semiconductor laser operating at 980 nm and having a front facet power of at least 50 mW.

In one embodiment, the container is cleaned with isopropyl alcohol, a commercially available product, Opticlear, or other suitable cleaning agent to remove residues of the manufacturing process, such as solder flux.

DETAILED DESCRIPTION OF THE INVENTION

It will be understood that the drawings are illustrative of the invention and are useful in the description thereof, but are not necessarily intended to depict the entire invention or the relative size of the parts of the invention.

Figure 1:
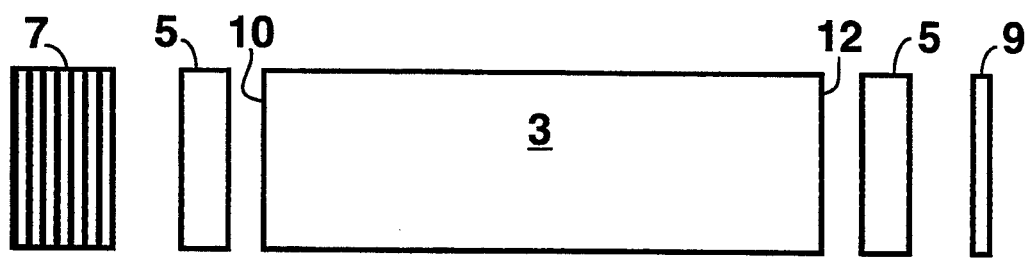
FIG. 1 is an exploded illustration of the semiconductor laser.

FIG. 1 illustrates the structure of a semiconductor laser, familiar to those skilled in the art. The front and back facets, 10 and 12 respectively, of laser body 3 are cleaved surfaces substantially parallel to one another. These facets are protected by passivation layers 5 which may be a layer of silicon. The passivation layer serves to protect the laser facet from contamination and erosion. The front facet mirror 9 is a coating of thickness approximately one quarter of the laser wavelength. The back facet mirror 7 is comprised of successive layers of reflective material, wherein adjacent layers are generally of different materials. The number, composition and thickness of the layers forming mirror 7 are chosen to give a target ratio of front facet to back facet transmitted power. A typical front to back facet power ratio is about 40:1.

A possible mechanism for failure of a semiconductor laser of the general type illustrated in FIG. 1. is as follows.

The emitting area at laser facet may be of the order of 10 square microns or less. Thus when power levels reach or exceed about 50 mW, the number of photons crossing a unit area (photon flux) of a facet is comparatively large. The probability of a photon interacting with a trace impurity in the laser enclosure rises in proportion to the photon flux. Hence the probability increases for photon breakdown of impurity molecules on or near the facet mirror.

The impurity molecules may originate from residues of soldering flux, epoxies, or cleaning materials, viz., isopropyl alcohol or Opticlear (a brand name cleaning agent for optical materials) used in the fabricating process. Examples of organic chemicals found in these materials are propene, terpene and abietic acid. The action of the infrared photons on such carbon chains may be to strip off water, leaving a reactive carbon chain fragment which can bind to an atom in the material which makes up the facet mirror. Alumina and silicon nitride are examples of mirror materials. The presence of free oxygen in the laser container may protect the facet mirrors by binding to the reactive fragments before the fragments bond to the facet mirror. An alternative possibility is that the free oxygen molecules break the "mirror-atom"-"carbon-chain-fragment" bond and thus remove the reactive fragment from the facet mirror. The oxygen thus may effectively act as a getter for impurity molecules.

In the above scenario, the amount of oxygen required to protect the facet mirror or facet structure would depend upon the number of impurity molecules as well as upon the number of other reactive sites present in the container which could bind to oxygen. Hence, the determination of the proper amount of oxygen to add to the gaseous medium filling the container would, in general, be experimental. Because of the known deleterious effects of oxygen, i.e., the reaction with hydrogen to form water which may undermine microcircuit integrity, the preferred amount of oxygen to add to the gaseous medium within the container is an amount just sufficient to maintain constant the properties of the facet structure.

The posited phenomena of impurity breakdown by photons would be most likely to occur at the higher power (higher photon flux) front facet. In the absence of free oxygen, the photo-reaction products could bind to or produce deposits on the facet structures, especially the mirror of the front facet. The deposits could change the reflectivity or absorptivity of the facet mirror. Increased absorptivity could increase the temperature at the facet to the melting point of the facet materials thereby destroying the facet. Thus, trace impurities which are essentially inconsequential at lower power levels, may become significant as the power level and associated photon flux increases. A successful strategy for realizing maximum laser life for lower photon flux lasers may become ineffective for higher photon flux lasers.

Assuming a photo-reaction is taking place, it is believed that a reactive gas, such as oxygen, present near a facet, binds to the reactive products of the photoreaction, as described above, thereby preventing these reactive products from precipitating onto the facet mirror or removing the reactive products already bound to the facet mirror. Oxygen thus becomes a protective element of the laser atmosphere as opposed to a potential factor in shortening the life of the microcircuit as taught in prior art.

It will be understood that the validity of the mechanism described immediately above is not essential to the invention nor is the mechanism put forward as necessary to the function of the invention.

It was found, as will be explained in the examples below, that a standard procedure, for example MIL-STD-1772A, for laser packaging which includes, cleaning the inside of the container with a substance such as isopropyl alcohol, filling the container with a dry inert gas and hermetically sealing the laser container, produced unacceptably short laser life, of the order of several tens of hours, for high power lasers, i.e., lasers producing a front facet power of at least 50 mW.

Lasers packaged per the standard procedure, except that dry air was introduced into the laser enclosure atmosphere, showed acceptable life. Furthermore, certain lasers which had begun to degrade in power when operated in a dry inert atmosphere, were found to recover when an environment of air was introduced.

COMPARATIVE EXAMPLE 1

A 980 nm InGaAs semiconductor laser was obtained from the IBM research facility in Zurich, Switzerland, with a structure substantially as shown in FIG. 1. The laser mirrors were configured to deliver 90% of total power through the front facet and 10% through the back facet. The laser was operated at a drive current of 195 mA which produced a front facet power of 150 mW. The laser was enclosed in a hermetically sealed container filled with a mixture of He/N in the ratio 1:9. Prior to sealing, the container was cleaned with isopropyl alcohol and a commercial cleaning fluid called Opticlear, a commonly used optical element cleaner. Water content of the atmosphere surrounding the laser was <1000 ppm.

Figure 4:
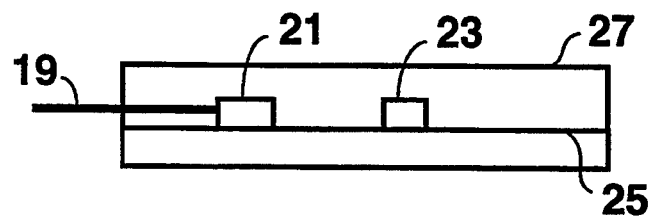
FIG. 4 is a side view cut away illustration of the laser device mounted within a container.

A semiconductor photodiode sensitive to the 980 nm wavelength was used to continuously monitor back facet power over time. Because of the front to back facet power ratio chosen for the laser, a small increase in front mirror reflectivity which produces only a small decrease in front facet power produces a proportionately larger increase in back facet power. Hence the back facet monitor is sensitive to small changes in front facet reflectivity. FIG. 4 is a cut away illustration of laser 21 and back facet photodiode 23 mounted on platform 25. The arrangement is sealed inside container 27.

Figure 2:
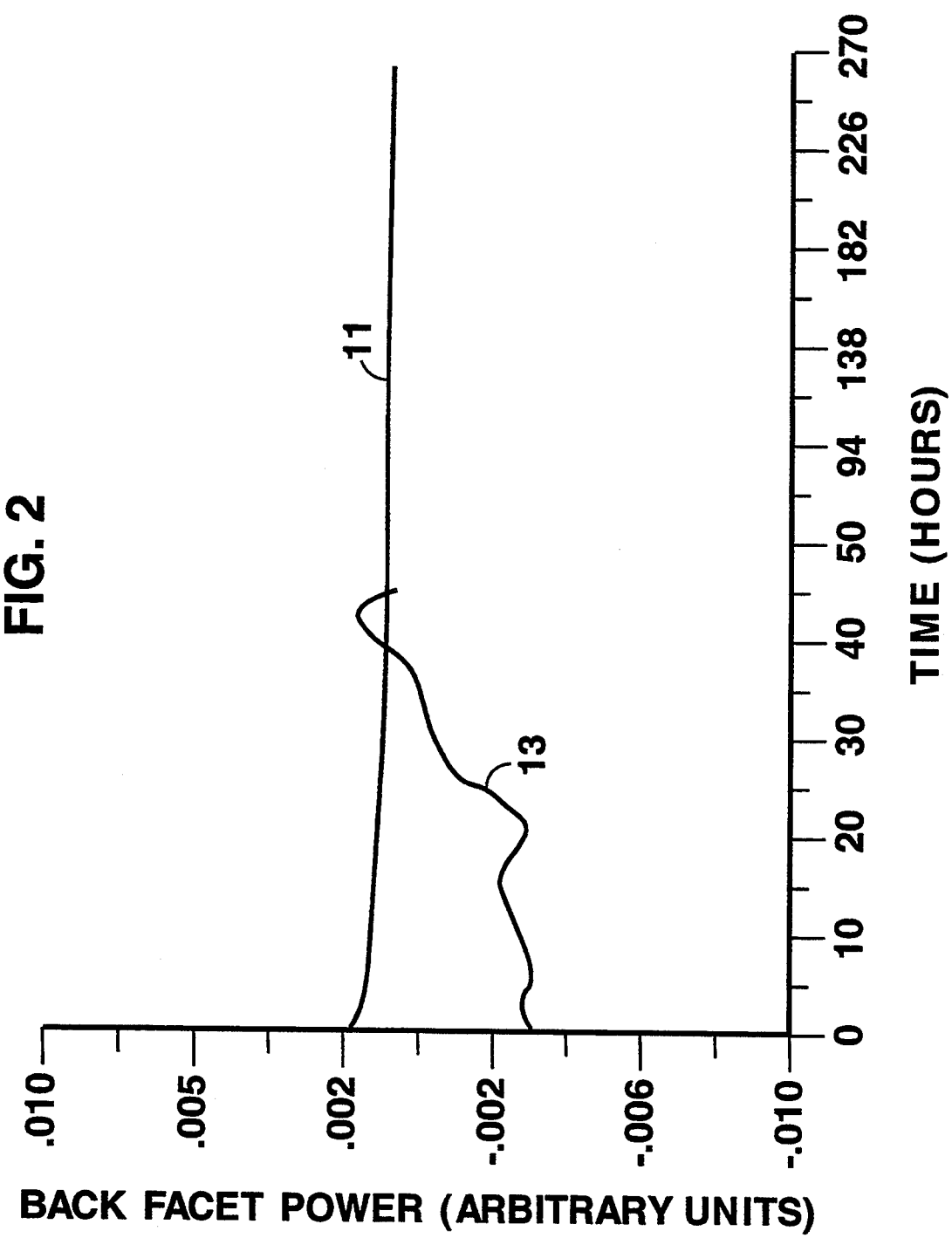

Referring to FIG. 2, line 13 shows the back facet power increase observed during approximately 45 hours of testing of the device of Comparative Example 1 with a He/N atmosphere. The sharp upward trend is indicative of an increase in front facet reflectivity and thus a premature laser failure.

COMPARATIVE EXAMPLE 2

Line 11 shows the back facet power measured for a laser, essentially identical to the laser of Comparative Example 1, packaged using the same procedure as for the Example 1 laser except that the dry He/N mixture is replaced by air. After 264 hours the back facet power curve is normal, indicative of a normal laser life expectancy.

COMPARATIVE EXAMPLE 3

Figure 3:
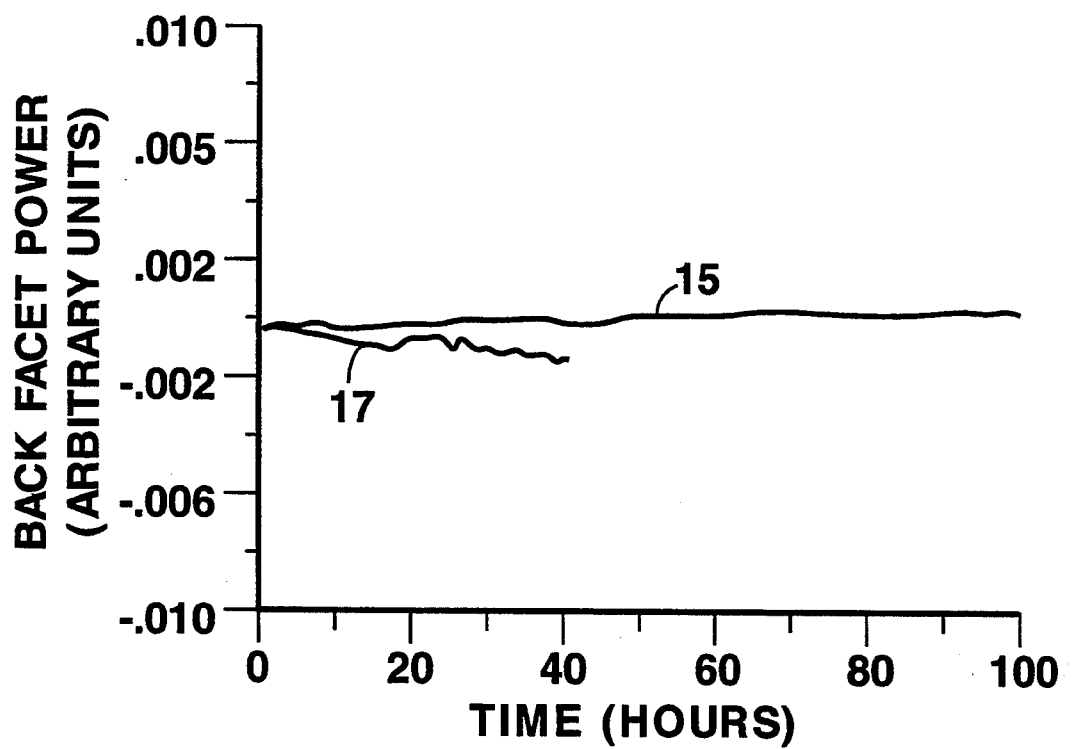
FIGS. 2 & 3 are charts illustrative of back facet power measured over time for semiconductor lasers packaged in a dry inert environment compared to lasers packaged in air.

A 980 nm InGaAs laser was packaged in a dry inert atmosphere as described in Example 1. Again drive current was about 195 mA and initial front facet power was about 150 mW. Referring to FIG. 3, line 15 shows a monotonic increase in back facet power. The data is predictive of premature laser failure. The testing was stopped at about 100 hours, before failure of the laser.

COMPARATIVE EXAMPLE 4

The laser container of Example 3 was punctured in ambient air, breaking the hermetic seal of the container to allow ingress of the ambient air. The laser drive current was reapplied and back facet power monitoring was resumed. Line 17 shows the back facet power decreasing to nominal level and then continuing with a normal aging slope. A normal aging slope is about 5% decrease in back facet power in 500 hours.

Repeated tests of lasers in dry air showed the superiority of that atmosphere over the atmosphere of dry He/N mixture.

It is believed that oxygen levels as low as 100 ppm may be sufficient to maintain the integrity of the laser facet mirror since thorough cleaning of the container can reduce vapor impurities to very low levels. Conversely, if vapor impurity level are relatively higher, oxygen levels should be increased to stoichiometrically react with the impurity molecules present.

The other elemental and compound gases, which in addition to oxygen make up air, are not believed to be preferred in preserving the integrity of the high power laser facet structure. Thus a mixture of oxygen with numerous commonly known gases would serve as a suitable gaseous medium for a high power semiconductor laser. For example a mixture of argon, helium or nitrogen and oxygen would constitute a suitable atmosphere for the laser.

Optical waveguide amplifier fiber 19 in FIG. 4 is shown coupled to the front facet of laser 21 and passing through the wall of container 27. This configuration is typical of a pump laser providing power to an amplifier fiber. Such a laser can operate at a wavelength in the range of about 800 nm to 1600 nm.

Although specific embodiments of my invention have hereinbefore been disclosed and described, it will be understood that the scope of my invention is nevertheless to be defined by the following claims.

I claim:

1. A packaged high power semiconductor laser comprising:
   a semiconductor laser; and,
   a hermetically sealed container surrounding said laser and filled with a gaseous medium wherein the oxygen content is greater than 100 ppm.

2. The package of claim 1 wherein said gaseous medium comprises components relatively inert with respect to the materials of said semiconductor laser and said oxygen content is an amount effective to prevent impurity depositions on the facet structure.

3. The package of claim 1 wherein the water content of said gaseous medium is less than 5000 ppm.

4. A high power semiconductor laser packaged in a hermetically sealed container filled with a dry gaseous medium including oxygen in an amount effective to prevent impurity depositions on the facet structure.

5. The laser of claim 4 wherein the front facet power of said laser is at least 50 mW.

6. A method for packaging a high power semiconductor laser comprising:
   fixedly positioning said laser in a container;
   introducing a gaseous medium including oxygen, in an amount effective to prevent impurity depositions on the facet structure, into said container; and,
   hermetically sealing said container.

7. The method of claim 6 wherein said gaseous medium contains less than 5000 ppm water.

8. A device for pumping an optical waveguide amplifier fiber comprising:
   a high power semiconductor laser; and,
   a hermetically sealed container enclosing said laser and filled with a gaseous medium including at least 100 ppm oxygen.

9. The device of claim 8 wherein the power at the front facet of said laser is at least 50 mW.

10. The device of claim 8 wherein said semiconductor laser operates at a wavelength in the range of about 800 nm to 1600 nm.

11. The device of claim 8 wherein the amount of said oxygen is effective to prevent impurity deposition on said laser facet structure.

* * * * *